United States Patent
Shin et al.

(10) Patent No.: US 9,728,661 B2
(45) Date of Patent: Aug. 8, 2017

(54) OPTOELECTRONIC DEVICE INCLUDING FERROELECTRIC MATERIAL

(71) Applicant: Samsung Electronics Co., Ltd., Suwon-Si, Gyeonggi-Do (KR)

(72) Inventors: Hyeonjin Shin, Suwon-si (KR); Sangwoo Kim, Yongin-si (KR); Kyungsik Shin, Daejeon (KR); Hye-Jung Park, Seoul (KR); Eunbi Cho, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 14/558,384

(22) Filed: Dec. 2, 2014

(65) Prior Publication Data
US 2015/0333196 A1 Nov. 19, 2015

(30) Foreign Application Priority Data
May 19, 2014 (KR) ........................ 10-2014-0059965

(51) Int. Cl.
*H01L 31/032* (2006.01)
*H01L 31/0224* (2006.01)
(Continued)

(52) U.S. Cl.
CPC .... *H01L 31/032* (2013.01); *H01L 31/022408* (2013.01); *H01L 31/0324* (2013.01);
(Continued)

(58) Field of Classification Search
CPC ......... H01L 31/0324; H01L 31/022408; H01L 29/0665
(Continued)

(56) References Cited

U.S. PATENT DOCUMENTS 8,378,329 B2 2/2013 Zaliznyak et al.
2010/0253184 A1* 10/2010 Choi ........................ H02N 2/18
310/339
(Continued)

FOREIGN PATENT DOCUMENTS

GB WO 2013140181 A1 * 9/2013 ............. B82Y 30/00
KR 20090024964 A 3/2009
(Continued)

OTHER PUBLICATIONS

Ju-Hyuck Lee et al., "Highly Sensitive Stretchable Transparent Piezoelectric Nanogenerators," Energy and Environmental Science, 2013, 6, pp. 169-175.

*Primary Examiner* — Christine Enad
(74) *Attorney, Agent, or Firm* — Harness, Dickey & Pierce P.L.C.

(57) ABSTRACT

Example embodiments relate to optoelectronic devices. An optoelectronic device may include a photoactive layer between first and second electrodes, and a ferroelectric layer corresponding to at least one of the first and second electrodes. At least one of the first and second electrodes may include graphene. The photoactive layer may include a two-dimensional (2D) semiconductor. The optoelectronic device may further include a third electrode, and in this case, the ferroelectric layer may be between the second electrode and the third electrode. The second electrode, the ferroelectric layer, and the third electrode may constitute a nanogenerator.

17 Claims, 9 Drawing Sheets

(51) Int. Cl.
*H01L 31/04* (2014.01)
*H01L 31/08* (2006.01)

(52) U.S. Cl.
CPC .............. *H01L 31/04* (2013.01); *H01L 31/08* (2013.01); *Y02E 10/50* (2013.01)

(58) Field of Classification Search
USPC .......................................................... 257/29
See application file for complete search history.

(56) References Cited

U.S. PATENT DOCUMENTS

| | | | | |
|---|---|---|---|---|
| 2010/0326503 | A1* | 12/2010 | Wang ....................... | H01G 9/20 136/255 |
| 2014/0103296 | A1* | 4/2014 | Yu ........................ | G01N 27/127 257/29 |
| 2015/0075602 | A1* | 3/2015 | Ozyilmaz ......... | H01L 31/02246 136/256 |
| 2015/0083206 | A1* | 3/2015 | Novoselov ............. | B82Y 30/00 136/256 |
| 2015/0085424 | A1* | 3/2015 | Ozyilmaz .............. | H01G 11/32 361/502 |
| 2015/0122315 | A1* | 5/2015 | Shin ....................... | H01L 29/73 136/255 |

FOREIGN PATENT DOCUMENTS

| | | | | |
|---|---|---|---|---|
| KR | 20090129298 A | | 12/2009 | |
| KR | 20130058011 A | | 5/2013 | |
| KR | 20130098884 A | | 9/2013 | |
| SG | WO 2013141817 A1 * | | 9/2013 | ..... H01L 31/022466 |
| SG | WO 2013180661 A1 * | | 12/2013 | .............. H01G 11/32 |

* cited by examiner

OPTOELECTRONIC DEVICE INCLUDING FERROELECTRIC MATERIAL

RELATED APPLICATION

This application claims the benefit of priority from Korean Patent Application No. 10-2014-0059965, filed on May 19, 2014, in the Korean Intellectual Property Office, the disclosure of which is incorporated herein in its entirety by reference.

BACKGROUND

1. Field

Example embodiments relate to optical devices, and/or to optoelectronic devices.

2. Description of the Related Art

Optoelectronic devices typically have optoelectrical characteristics of a semiconductor material. An optoelectronic device generally includes a device that converts optical energy into electrical energy and a device that converts electrical energy into optical energy. Examples of the device that converts optical energy into electrical energy include a photodiode and a solar cell. The photodiode may be used as a photodetector in a state where an external voltage is applied to the photodiode. That is, in a state where an external voltage is applied to the photodiode, the photodiode may be used as a photodetector by detecting photocurrent generated from the photodiode when light having a particular wavelength is irradiated onto the photodiode. Meanwhile, the solar cell uses the photovoltaic effect.

Recently, attempts for applying a two-dimensional (2D) material to the optoelectronic device have been made. However, when applying a 2D material to the optoelectronic device, there typically is a difficulty in making a desired energy band structure and it is not easy to secure photovoltaic or photoconductive characteristics of the optoelectronic device.

SUMMARY

Example embodiments relate to optoelectronic devices which energy band structures may be easily controlled.

Example embodiments relate to optoelectronic devices which optical detection sensitivity may be easily adjusted and/or improved.

Example embodiments relate to self-powered optoelectronic devices (photodetectors) that may exhibit photoconductive characteristics without applying external voltages thereto.

Example embodiments relate to optoelectronic devices (solar cells) having improved photovoltaic characteristics.

Example embodiments relate to optoelectronic devices having energy harvesting functions.

Example embodiments relate to optoelectronic devices that may secure the above-described characteristics while including two-dimensional (2D) materials.

Additional example embodiments will be set forth in part in the description which follows and, in part, will be apparent from the description, or may be learned by practice thereof.

According to at least one example embodiment, an optoelectronic device includes a first electrode, a second electrode separated from the first electrode, a photoactive layer between the first and second electrodes, and a ferroelectric layer disposed on a surface of the second electrode.

The first electrode, the photoactive layer, the second electrode, and the ferroelectric layer may be sequentially disposed on a substrate.

The ferroelectric layer, the second electrode, the photoactive layer, and the first electrode may be sequentially disposed on the substrate.

At least one of the first and second electrodes may include graphene.

The photoactive layer may include a two-dimensional (2D) semiconductor.

The ferroelectric layer may include at least one ferroelectric polymer.

The ferroelectric layer may include an organic material or an inorganic material.

The ferroelectric layer may have positive or negative polarization at a surface of the ferroelectric layer that is adjacent to the second electrode.

The ferroelectric layer may be configured to adjust a height of an energy barrier between the second electrode and the photoactive layer.

The optoelectronic device may be or include a photodetector or a photovoltaic device.

The photodetector may be or include a self-powered photodetector.

The optoelectronic device may further include a third electrode that is separated from the second electrode. In this case, the ferroelectric layer may be disposed between the second and third electrodes.

The first electrode, the photoactive layer, the second electrode, the ferroelectric layer, and the third electrode may be sequentially disposed on a substrate.

The third electrode, the ferroelectric layer, the second electrode, the photoactive layer, and the first electrode may be sequentially disposed on a substrate.

At least one of the first through third electrodes may include graphene, and the photoactive layer may include a 2D semiconductor.

The optoelectronic device may further include a diffusion barrier layer between the second electrode and the ferroelectric layer.

The diffusion barrier layer may be a protection layer for protecting the second electrode.

The diffusion barrier layer may include a 2D insulating layer.

The diffusion barrier layer may have a thickness equal to or less than about 5 nm.

The second electrode, the ferroelectric layer, and the third electrode may constitute a piezoelectric nanogenerator.

The piezoelectric nanogenerator may be configured to generate electricity due to vibration.

The optoelectronic device may further include an electric storage device connected to the first electrode, the second electrode, and the third electrode.

According to another example embodiment, an optoelectronic apparatus includes an optoelectronic element including a photoactive layer, a nanogenerator connected to the optoelectronic element and including a ferroelectric substance, and an electric storage device connected to the optoelectronic element and the nanogenerator.

The optoelectronic apparatus may include a first graphene layer, a second graphene layer, and a third graphene layer, and the photoactive layer may be disposed between the first graphene layer and the second graphene layer, and the ferroelectric substance may be disposed between the second graphene layer and the third graphene layer.

The optoelectronic apparatus may further include a diffusion barrier layer disposed between the second graphene layer and the ferroelectric substance.

The photoactive layer may include a two-dimensional (2D) semiconductor.

The ferroelectric substance may include an organic material or an inorganic material.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
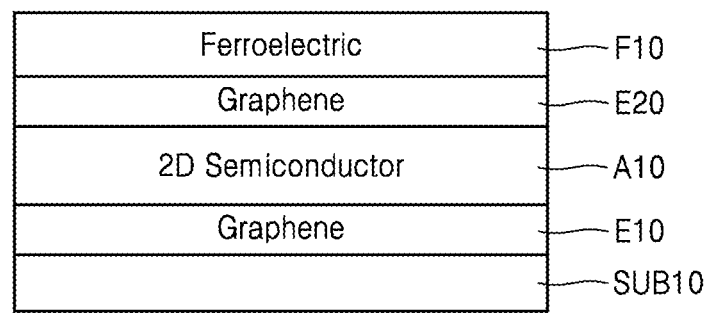
FIG. 1 is a cross-sectional view of an optoelectronic device according to at least one example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain the example embodiments.

FIG. 1 is a cross-sectional view of an optoelectronic device according to an example embodiment.

Referring to FIG. 1, the optoelectronic device according to at least one example embodiment may include first and second electrodes E10 and E20 that are separate from each other and a photoactive layer A10 interposed between the first and second electrodes E10 and E20. At least one of the first and second electrodes E10 and E20 may include graphene. Both the first and second electrodes E10 and E20 may be a graphene layer. In this case, the graphene layer may be a single layer of graphene formed of one graphene, or may have a structure in which a plurality of graphenes or graphene layers (a plurality of graphenes within about 100 layers) overlap each other (are stacked).

The photoactive layer A10 may include a two-dimensional (2D) semiconductor. The 2D semiconductor may be a metal chalcogenide-based material. The metal chalcogenide-based material may include one transition metal of molybdenum (Mo), tungsten (W), niobium (Nb), vanadium (V), tantalum (Ta), titanium (Ti), zirconium (Zr), hafnium (Hf), technetium (Tc), and rhenium (Re), and one chalcogen element from sulfur (S), selenium (Se), and tellurium (Te). The metal chalcogenide-based material may be a transition metal dichalcogenide (TMDC) material. The TMDC material may be expressed as $MX_2$, for example, where M is a transition metal and X is a chalcogen element. The M may be one of Mo, W, Nb, V, Ta, Ti, Zr, Hf, Tc, and Re, and the X may be one of S, Se, and Te. The TMDC material may be $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, and $ReSe_2$, for example. The metal chalcogenide-based material may not be expressed as $MX_2$. For example, a compound (a transition metal chalcogenide material) of copper (Cu) and sulfur (S) may be expressed as CuS, where Cu is a transition metal and S is a chalcogen element. Since such CuS may be a 2D material, CuS may be used as the metal chalcogenide-based material. The metal chalcogenide-based material may be a chalcogenide material including a non-transition metal. The non-transition metal may be one of gallium (Ga), indium (In), tin (Sn), germanium (Ge), and lead (Pb), for example. That is, a compound of the non-transition metal, such as Ga, In, Sn, Ge, or Pb, and a chalcogen element, such as S, Se, or Te, may be used as the metal chalcogenide-based material. The chalcogenide material including the non-transition metal may be one of $SnSe_2$, GaS, GaSe, GaTe, GeSe, $In_2Se_3$, and $InSnS_2$. Thus, the metal chalcogenide-based material may include one metal element from Mo, W, Nb, V, Ta, Ti, Zr, Hf, Tc, Re, Cu, Ga, In, Sn, Ge, and Pb and one chalcogen element from S, Se, and Te. However, the above-mentioned materials (elements) are just examples, and other materials (elements) may be used. $MoS_2$, $MoSe_2$, $MoTe_2$, $WSe_2$, and $WTe_2$ among the above-described materials may be n-type semiconductors, and $WS_2$, $ZrS_2$, $ZrSe_2$, $HfS_2$, $HfSe_2$, and $NbSe_2$ among the above-described materials may be p-type semiconductors.

According to at least one example embodiment, the optoelectronic device may include a ferroelectric layer F10 disposed on a surface of one of the first electrode E10 and the second electrode E20, for example, on a surface of the second electrode E20. The ferroelectric layer F10 may be disposed on a top surface of the second electrode E20. In this case, the second electrode E20 may be disposed between the photoactive layer A10 and the ferroelectric layer F10. The ferroelectric layer F10 may have electric polarization characteristics. For example, the ferroelectric layer F10 may have a positive (+) polarization on its bottom surface portion and a negative (−) polarization on its top surface portion, or vice versa. An energy band structure of the second electrode E20 and/or the photoactive layer A10 may be adjusted by the ferroelectric layer F10. In other words, an electric field caused by polarization of the ferroelectric layer F10 may affect the characteristics of the second electrode E20 and/or the photoactive layer A10. For example, a Schottky barrier height between the second electrode E20 and the photoactive layer A10 may be adjusted by the ferroelectric layer F10. Also, the extent to which the ferroelectric layer F10 affects the second electrode E20 and/or the photoactive layer A10 may vary according to a polarization degree and a polarization direction (electric field direction) of the ferroelectric layer F10. Regarding the functions of the ferroelectric layer F10, the photoelectronic device according to an example embodiment may have excellent characteristics and various advantages. In more detail, according to an example embodiment, it is possible to embody an optoelectronic device of which optical detection sensitivity (photodetection sensitivity) may be easily adjusted/improved through controlling energy band structures thereof. Also, a self-powered optoelectronic device (photodetector) that may exhibit photoconductive characteristics without applying an external voltage thereto may be implemented. Furthermore, an optoelectronic device (solar cell) having excellent photovoltaic characteristics may be implemented.

The ferroelectric layer F10 may include a ferroelectric polymer, for example. As a specific example, the ferroelectric layer F10 may include polyvinylidene fluoride (PVDF). Alternatively, the ferroelectric layer F10 may include poly (vinylidene fluoride-trifluoroethylene), that is, P(VDF-TrFE), or include poly(vinylidene fluoride-trifluoroethylene-chlorofluoroethylene), that is, P(VDF-TrFE-CFE). In this way, when the ferroelectric layer F10 is formed of a polymer (organic material), the ferroelectric layer F10 may have flexible characteristics or stretchable characteristics. However, the material used to form the ferroelectric layer F10 is not limited to the above description and may vary. The ferroelectric layer F10 may be formed of an inorganic material instead of a polymer (organic material). For example, the ferroelectric layer F10 may include an inorganic material, such as $Pb(Zr,Ti)O_3$ [i.e., PZT], $SrBi_2Ta_2O_9$ [i.e., SBT], $Bi_4Ti_3O_{12}$, or $BaTiO_3$. In addition, the material for the ferroelectric layer F10 may vary.

In an example embodiment, the first electrode E10, the photoactive layer A10, the second electrode E20, and the ferroelectric layer F10 may be sequentially stacked on a substrate SUB10. In this case, the substrate SUB10 may be a polymer substrate but may be other substrates, for example, a silicon substrate, a sapphire substrate, and a glass substrate. There are no limitations to the type of the substrate SUB10, and various substrates used in semiconductor device processes may be applied as the substrate SUB10.

Figure 2:
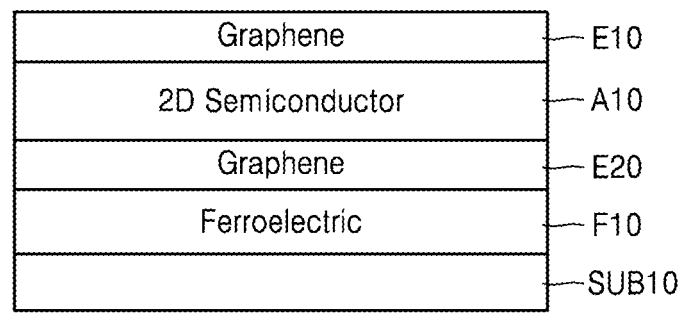
FIG. 2 is a cross-sectional view of an optoelectronic device according to another example embodiment.

According to another example embodiment, a stack order of the layers, namely, the first electrode E10, the photoactive layer A10, the second electrode E20, and the ferroelectric layer F10, may vary. For example, as illustrated in FIG. 2, the ferroelectric layer F10, the second electrode E20, the photoactive layer A10, and the first electrode E10 may be sequentially stacked on the substrate SUB10. The stack structure of FIG. 2 from the ferroelectric layer F10 to the first electrode E10 may be, for example, substantially the same as an upside-down structure of the stack structure of FIG. 1 from the first electrode E10 to the ferroelectric layer F10.

Figure 3:
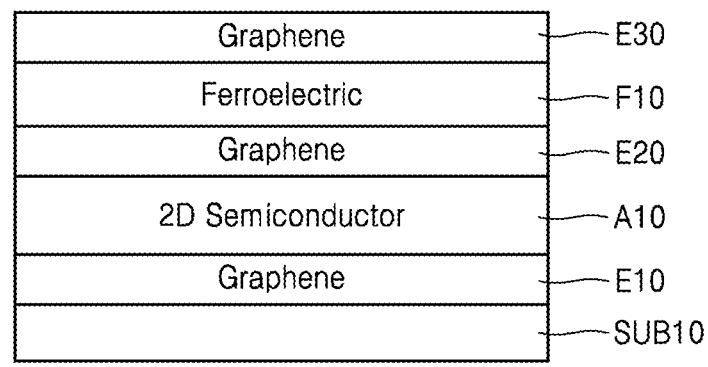
FIG. 3 is a cross-sectional view of an optoelectronic device according to another example embodiment.

FIG. 3 is a cross-sectional view of an optoelectronic device according to another example embodiment.

Referring to FIG. 3, a first electrode E10, a photoactive layer A10, a second electrode E20, a ferroelectric layer F10, and a third electrode E30 may be sequentially disposed on a substrate SUB10. A structure from the substrate SUB10 to the ferroelectric layer F10 may be substantially the same as or similar to the structure of FIG. 1. That is, materials/characteristics of the substrate SUB10, the first electrode E10, the photoactive layer A10, the second electrode E20, and the ferroelectric layer F10 of FIG. 3 may be substantially the same as or similar to materials/characteristics of the first electrode E10, the photoactive layer A10, the second electrode E20, and the ferroelectric layer F10 of FIG. 1, respectively. The third electrode E30 of FIG. 3 may include graphene, for example. The third electrode E30 may be a graphene layer. In this case, the graphene layer may be a single graphene layer formed of one graphene or may have a structure in which a plurality of graphenes (a plurality of graphenes within about 100 layers) overlap each other (are stacked).

In FIG. 3, the second electrode E20 and the third electrode E30 may be used as electrodes for a process of forming polarity on the ferroelectric layer F10, i.e., a poling process. Polarity may be formed on the ferroelectric layer F10 by applying a positive voltage and a negative voltage to the second electrode E20 and the third electrode E30, respectively, or vice versa. The poling process may be made possible by using only one electrode of the second electrode E20 and the third electrode E30. Thus, even when an electrode (i.e., the second electrode E20) is disposed only at one side of the ferroelectric layer F10, as illustrated in FIG. 1, polarity may be formed on the ferroelectric layer F10 by using the poling process.

Figure 4:
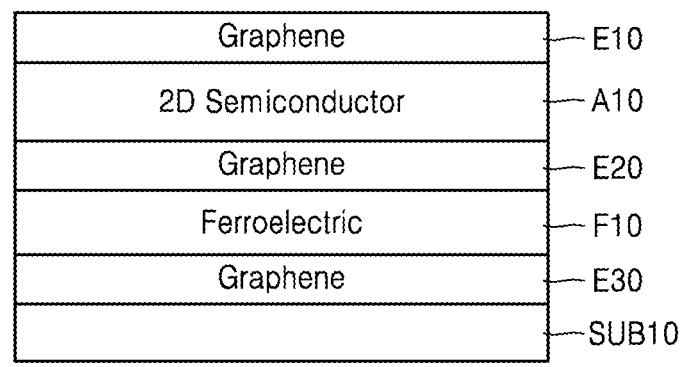
FIG. 4 is a cross-sectional view of an optoelectronic device according to another example embodiment.

According to another example embodiment, a stack order of the layers, namely, the first electrode E10, the photoactive layer A10, the second electrode E20, the ferroelectric layer F10, and the third electrode E30 in FIG. 3, may vary. For example, as illustrated in FIG. 4, the third electrode E30, the ferroelectric layer F10, the second electrode E20, the photoactive layer A10, and the first electrode E10 may be sequentially stacked on the substrate SUB10. The stack structure of FIG. 4 from the third electrode E30 to the first electrode E10 may be substantially the same as or similar to an upside-down structure of the stack structure of FIG. 3 from the first electrode E10 to the third electrode E30.

In FIGS. 3 and 4, the second electrode E20, the third electrode E30, and the ferroelectric layer F10 interposed therebetween may constitute a nanogenerator. That is, the stack structure of the second electrode E20, the ferroelectric layer F10, and the third electrode E30 may be used as a nanogenerator. The nanogenerator may be a piezoelectric nanogenerator. The ferroelectric layer F10 may have piezoelectric characteristics. Thus, the ferroelectric layer F10 may generate electrical energy due to mechanical deformation. In this regard, the nanogenerator, including the ferroelectric layer F10, may have a function of generating electricity due to external vibration. For example, the nanogenerator may generate power due to vibration resulting from sound/acoustic waves, bending, or wind, i.e., mechanical vibration resulting from an external factor. Thus, the optoelectronic device, including the nanogenerator, according to an example embodiment, may have an energy harvesting function.

In the example embodiments illustrated in FIGS. 3 and 4, when the stack structure of the second electrode E20, the ferroelectric layer F10 and the third electrode E30 is used as a nanogenerator, the optoelectronic device may further include an 'electric storage device' for storing electricity generated by the nanogenerator. An example thereof is shown in FIG. 5.

Figure 5:
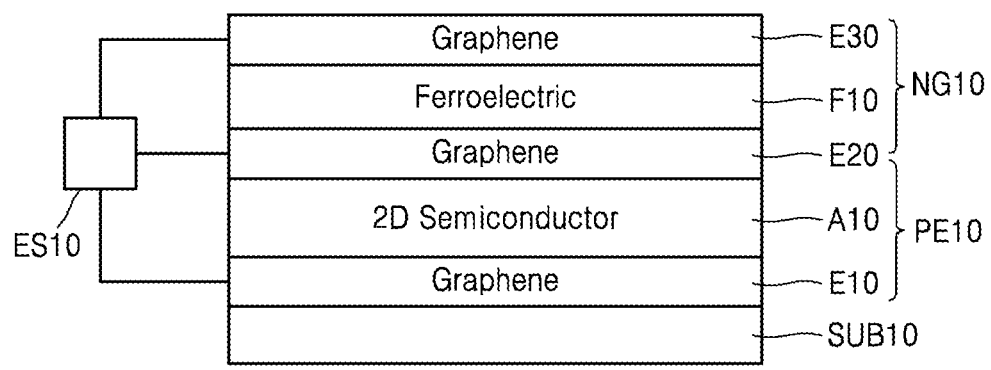
FIG. 5 is a cross-sectional view of an optoelectronic device according to another example embodiment.

Referring to FIG. 5, a combination of the second electrode E20, the ferroelectric layer F10, and the third electrode E30 may constitute a nanogenerator NG10. Furthermore, a combination of the first electrode E10, the photoactive layer A10, and the second electrode E20 may constitute an optoelectronic element PE10. The second electrode E20 may be used as an 'upper electrode' with respect to the optoelectronic element PE10 and may be used as a 'lower electrode' with respect to the nanogenerator NG10. An electric storage device ES10 may be provided to be connected to the first electrode E10, the second electrode E20, and the third electrode E30. The electric storage device ES10 may be connected to the nanogenerator NG10 and the optoelectronic element PE10. The electric storage device ES10 may be an electric condenser (a capacitor, a super capacitor), a secondary battery, or the like. Electrical energy generated in the nanogenerator NG10 may be stored in the electric storage device ES10. The electrical energy stored in the electric storage device ES10 may be used to drive the optoelectronic element PE10. Thus, the optoelectronic device according to the example embodiment may be a self-powered device (photodetector) that drives the optoelectronic element PE10 by using electricity generated in the nanogenerator NG10. Also, the optoelectronic device according to the example embodiment may be a self-powered energy harvesting device.

According to another example embodiment, in the structures of FIGS. 1 through 5, a 'diffusion barrier layer' (diffusion prevention layer) may be disposed between the second electrode E20 and the ferroelectric layer F10. An example thereof is shown in FIG. 6.

Figure 6:
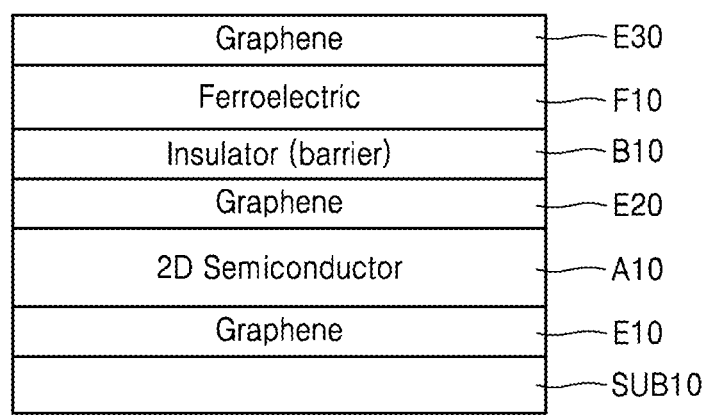
FIG. 6 is a cross-sectional view of an optoelectronic device according to another example embodiment.

Referring to FIG. 6, a diffusion barrier layer B10 may be disposed between the second electrode E20 and the ferroelectric layer F10. The example embodiment illustrates a case where the diffusion barrier layer B10 is added to the structure of FIG. 3. The diffusion barrier layer B10 may prevent a material of the ferroelectric layer F10 from being diffused into the second electrode E20. The diffusion barrier layer B10 may include a two-dimensional (2D) insulator. For example, the diffusion barrier layer B10 may include a 2D insulator, such as, for example, hexagonal boron nitride (h-BN). Also, the diffusion barrier layer B10 may have a thickness that is equal to or less than about 5 nm. The diffusion barrier layer B10 may not disturb the electrical effect of the ferroelectric layer F10 on the second electrode E20 and the photoactive layer A10, and may prevent the material of the ferroelectric layer F10 from being diffused into the second electrode E20. The diffusion barrier layer B10 may be a 'protection layer' for protecting the second electrode E20. The diffusion barrier layer B10 may be formed of a different material from the 2D material, for example, a general insulating material, such as, for example, silicon oxide or silicon nitride. Even when the diffusion barrier layer B10 is provided, its thickness is relatively small so that characteristics of the second electrode E20 and/or the photoactive layer A10 may be easily controlled by the polarization of the ferroelectric layer F10.

FIG. 6 illustrates a case where the diffusion barrier layer B10 is applied to the structure of FIG. 3. The diffusion barrier layer B10 of FIG. 6 may be similarly applied to the structures of FIGS. 1, 2, 4, and 5.

FIGS. 7A-7B and 8A-8B illustrate a change in energy bands due to a ferroelectric layer F10 of an optoelectronic device, according to example embodiments.

FIGS. 7A-7B and 8A-8B show energy bands when the first electrode E10, the photoactive layer A10, and the second electrode E20 of FIG. 1 are independently disposed, that is, when they are spaced apart from each other, and FIGS. 7A-7B and 8A-8B show energy bands when the first electrode E10, the photoactive layer A10, and the second electrode E20 are joined (i.e., are contact with one another), as in an actual device. $E_V$ and $E_C$ in FIGS. 7A, 7B, 8A, and 8B represent a valence band maximum energy level and a conduction band minimum energy level, respectively, and $E_F$ represents a Fermi energy level, as also in FIGS. 9A, 9B, 10A, and 10B.

Figure 7A:
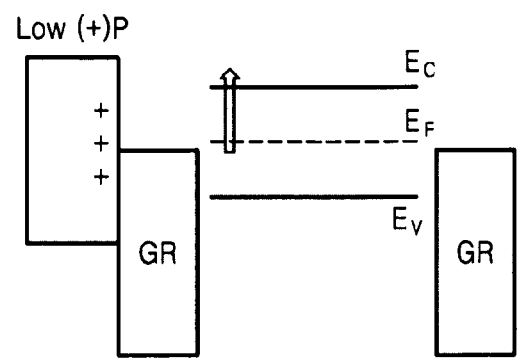
FIGS. 7A-7B and 8A-8B illustrate a change in energy bands due to a ferroelectric layer of an optoelectronic device according to example embodiments.
Figure 7B:
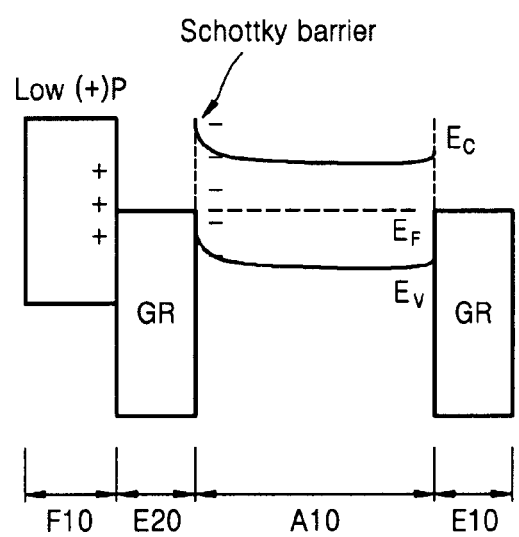
Figure 8A:
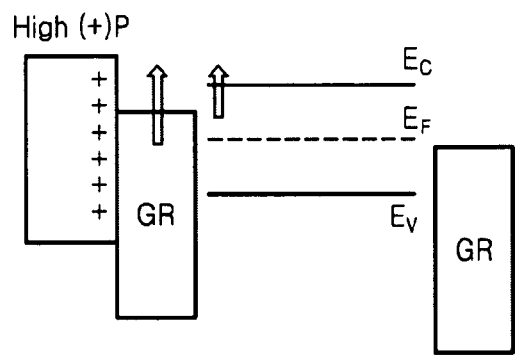
Figure 8B:
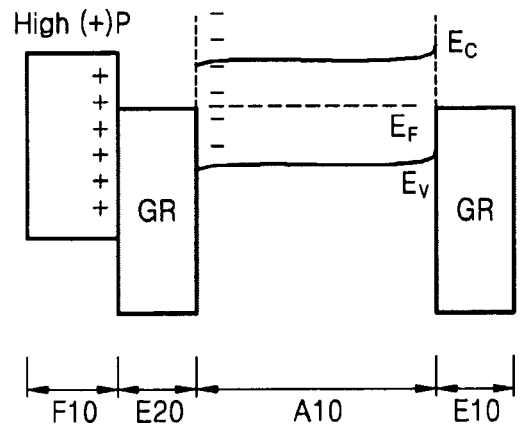

A difference between FIGS. 7A-7B and FIGS. 8A-8B is a degree of polarization of the ferroelectric layer F10. FIGS. 7A-7B show a case where the ferroelectric layer F10 has a 'low positive polarization', i.e., 'Low (+)P', at a surface portion of the ferroelectric layer F10 that is adjacent to the second electrode E20, and FIG. 8A-8B shows a case where the ferroelectric layer F10 has a 'high positive polarization', i.e., 'High (+)P', at a surface portion of the ferroelectric layer F10 that is adjacent to the second electrode E20. For example, FIGS. 7A-7B may show a case where the ferroelectric layer F10 has a low polarization degree (low polarization intensity) that is equal to or less than about 4 µC/cm² at the surface of the ferroelectric layer F10 that is adjacent to the second electrode E20, and FIG. 8A-8B may show a case where the ferroelectric layer F10 has a high polarization degree (high polarization intensity) that is greater than about 4 µC/cm² at the surface of the ferroelectric layer F10 that is adjacent to the second electrode E20. The polarization degree of 4 µC/cm² may be converted into an electric field intensity of 70 MV/m.

Referring to FIGS. 7A-7B, when the ferroelectric layer F10 has a low positive polarization degree, the ferroelectric layer F10 may hardly affect the second electrode E20 but may mainly affect the photoactive layer A10. In this case, the Schottky barrier height between the second electrode E20 and the photoactive layer A10 may be increased due to polarization of the ferroelectric layer F10. Thus, the optoelectronic device may be used as a photodetector having photoconductive characteristics without an external voltage applied thereto. That is, the optoelectronic device may be a self-powered photodetector. Also, the optoelectronic device may be used as a solar cell having excellent photovoltaic characteristics.

Referring to FIG. 8A-8B, when the ferroelectric layer F10 has a high positive polarization degree, the ferroelectric layer F10 may cause an n-type doping effect on the second electrode E20. Also, the ferroelectric layer F10 may affect an energy band of the photoactive layer A10. In this case, an energy barrier between the second electrode E20 and the photoactive layer A10 may be decreased. When the optoelectronic device having the energy band structure is used as a photodetector, it may be required to apply an external voltage, but photodetection sensitivity may be improved. Thus, a photodetector having adjusted/improved sensitivity may be implemented.

FIGS. 9A-9B and 10A-10B illustrate a change in energy bands due to a ferroelectric layer F10 of an optoelectronic device according to other example embodiments. FIGS. 9A-9B and 10A-10B show energy bands when the first electrode E10, the photoactive layer A10 and the second electrode E20 of FIG. 1 are independently disposed, i.e., a case where they are spaced apart from each other, and FIGS. 9A-9B and 10A-10B show energy bands when the first electrode E10, the photoactive layer A10, and the second electrode E20 are joined (i.e., in contact one another) as in an actual device.

Figure 9A:
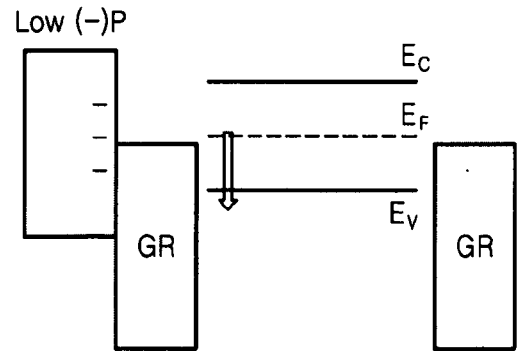
FIGS. 9A-9B and 10A-10B. illustrate a change in energy bands due to a ferroelectric layer of an optoelectronic device according to other example embodiments.
Figure 9B:
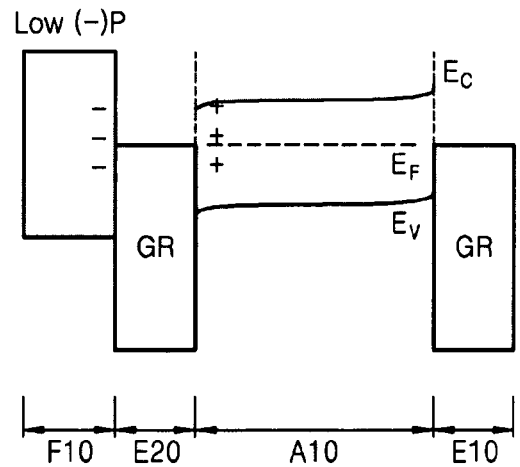
Figure 10A:
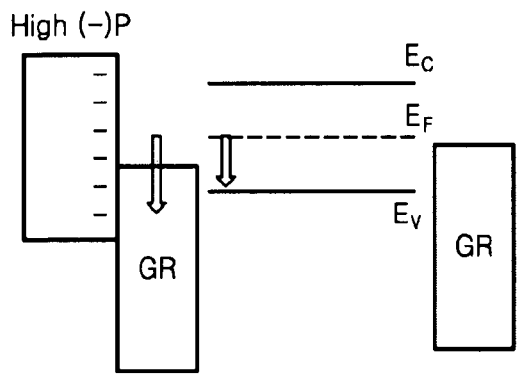
Figure 10B:
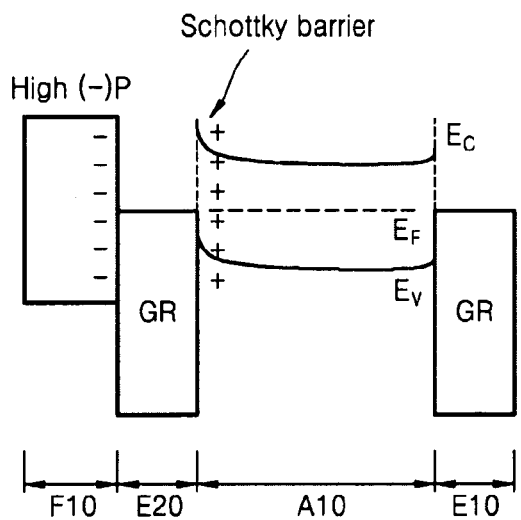

A difference between FIGS. 9A-9B and FIGS. 10A-10B is a degree of polarization of the ferroelectric layer F10. FIG. 9A-9B shows a case where the ferroelectric layer F10 has a 'low negative polarization', i.e., 'Low (−)P', at a surface portion of the ferroelectric layer F10 that is adjacent to the second electrode E20, and FIGS. 10A-10B shows a case where the ferroelectric layer F10 has a 'high negative polarization', i.e., 'High (−)P', at a surface portion of the ferroelectric layer F10 that is adjacent to the second electrode E20. For example, FIG. 9A-9B may show a case where the ferroelectric layer F10 has a low polarization degree (low polarization intensity) that is equal to or less than about (−)4 µC/cm² at the surface of the ferroelectric layer F10 that is adjacent to the second electrode E20, and FIGS. 10A-10B may show a case where the ferroelectric layer F10 has a high polarization degree (high polarization intensity) that is greater than about (−)4 µC/cm² at the surface of the ferroelectric layer F10 that is adjacent to the second electrode E20.

Referring to FIG. 9A-9B, when the ferroelectric layer F10 has a low negative polarization degree, the ferroelectric layer F10 may have an energy band that is the same as or similar to the energy band of FIG. 8A-8B. The ferroelectric layer F10 may hardly affect the second electrode E20 but may mainly affect the photoactive layer A10. Thus, an energy barrier between the second electrode E20 and the photoactive layer A10 may be lowered by the ferroelectric layer F10. In this case, the contact characteristics between the second electrode E20 and the photoactive layer A10 may be the same as or similar to the contact characteristics of an ohmic contact, and the contact characteristics between the first electrode E10 and the photoactive layer A10 may be the same as or similar to the contact characteristics of a Schottky contact. When the optoelectronic device having an energy band structure as discussed above is used as a photodetector, an external voltage may need to be applied to the optoelectronic device, but photodetection sensitivity may be improved. Thus, a photodetector having adjusted/improved sensitivity may be implemented.

Referring to FIGS. 10A-10B, when the ferroelectric layer F10 has a high negative polarization degree, the optoelectronic device may have an energy band that is the same as or similar to the energy band of FIGS. 7A-7B. The ferroelectric layer F10 may cause a p-type doping effect on the second electrode E20. Also, the ferroelectric layer F10 may somewhat affect an energy band of the photoactive layer A10. In this case, as such, a Schottky barrier height between the second electrode E20 and the photoactive layer A10 may be increased. Thus, the optoelectronic device may be used as a photodetector having excellent photoconductive characteristics without an external voltage applied thereto. That is, the optoelectronic device may be a self-powered photodetector. Also, the optoelectronic device may be used as a solar cell having excellent photovoltaic characteristics.

The energy band structures described with reference to FIGS. 7A-7B through 10A-10B are just examples and may be changed in various ways. Also, the effect of the ferroelectric layer F10 on the second electrode E20 and/or the photoactive layer A10 is an example, and there may be unexplained effects, and thus, the energy band structures may be changed.

In the above example embodiments, a 'vertical device', in which the first electrode E10, the photoactive layer A10, and the second electrode E20 are arranged in a vertical direction, has been mainly illustrated and described. However, example embodiments are not limited thereto. According to another example embodiment, an optoelectronic device of a 'planar type' or lateral in which the first electrode E10, the photoactive layer A10, and the second electrode E20 are arranged in a horizontal direction may be configured. This will be described with reference to FIGS. 11 through 14 in more detail.

Figure 11:
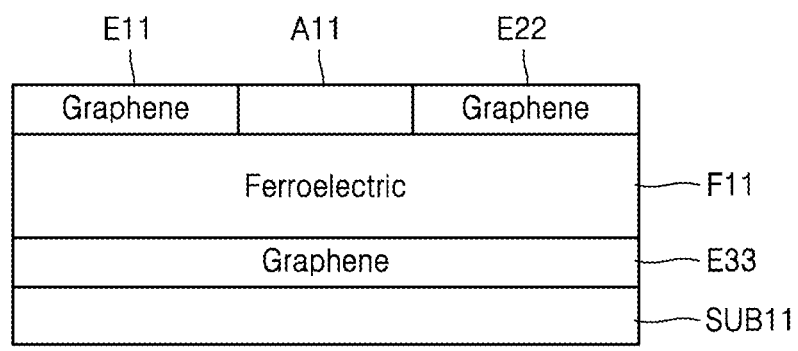
FIG. 11 is a cross-sectional view of an optoelectronic device according to another example embodiment.

FIG. 11 is a cross-sectional view of an optoelectronic device according to another example embodiment.

Referring to FIG. 11, a third electrode E33 may be disposed on a substrate SUB11, and a ferroelectric layer F11 may be disposed on the third electrode E33. A first electrode E11 and a second electrode E22 may be separately disposed on the ferroelectric layer F11, and a photoactive layer A11 may be disposed between the first electrode E11 and the second electrode E22. Thus, the first electrode E11, the photoactive layer A11, and the second electrode E22 may be arranged in a horizontal or lateral direction. Materials/characteristics of the substrate SUB11, the first electrode E11, the second electrode E22, the third electrode E33, the photoactive layer A11, and the ferroelectric layer F11 may be substantially the same as or similar to materials and/or characteristics of the substrate SUB10, the first electrode E10, the second electrode E20, the third electrode E30, the photoactive layer A10, and the ferroelectric layer F10 of FIG. 3, respectively.

In the example embodiment of FIG. 11, the ferroelectric layer F11 may affect only one of the first and second electrodes E11 and E22. For example, when a poling process using the second electrode E22 and the third electrode E33 is performed, polarity may be selectively generated in the ferroelectric layer F11 under the second electrode E22. In this case, no polarity may be formed in a portion of the ferroelectric layer F11 under the first electrode E11. Thus, the ferroelectric layer F11 may affect only the second electrode E22 of the first and second electrodes E11 and E22. Also, the ferroelectric layer F11 may affect a portion of the photoactive layer A11 that is adjacent to the second electrode E22. The effects of the ferroelectric layer F11 on the second electrode E22 and the photoactive layer A11 that is adjacent to the second electrode E22 may be the same as or similar to the effects of the ferroelectric layer F10 on the second electrode E20 and the photoactive layer A10, as illustrated in FIGS. 1 through 5.

In another case, in the example embodiment of FIG. 11, a portion of the ferroelectric layer F11 under the first electrode E11 may have a first polarity, and a portion of the ferroelectric layer F11 under the second electrode E22 may have a second polarity. For example, when a first poling process using the first electrode E11 and the third electrode E33 is performed and a second poling process using the second electrode E22 and the third electrode E33 is performed, the portion of the ferroelectric layer F11 under the first electrode E11 and the portion of the ferroelectric layer F11 under the second electrode E22 may have different polarities. In this case, energy band structures of the first electrode E11, the photoactive layer A11, and the second electrode E22 may be changed in more various ways using the ferroelectric layer F11.

According to another example embodiment, in FIG. 11, the structure of the photoactive layer A11 may be modified in various ways. For example, as illustrated in FIG. 12, both ends or lateral portions of a photoactive layer A12 may extend to cover at least a portion of top surfaces of the first electrode E11 and the second electrode E22.

Figure 12:
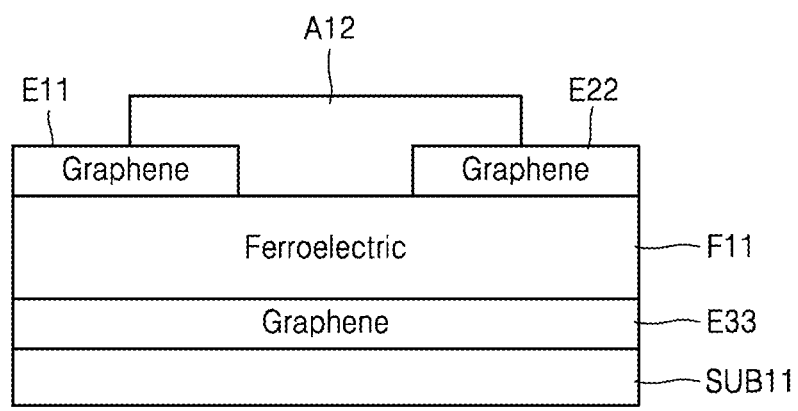
FIG. 12 is a cross-sectional view of an optoelectronic device according to another example embodiment.
Figure 13:
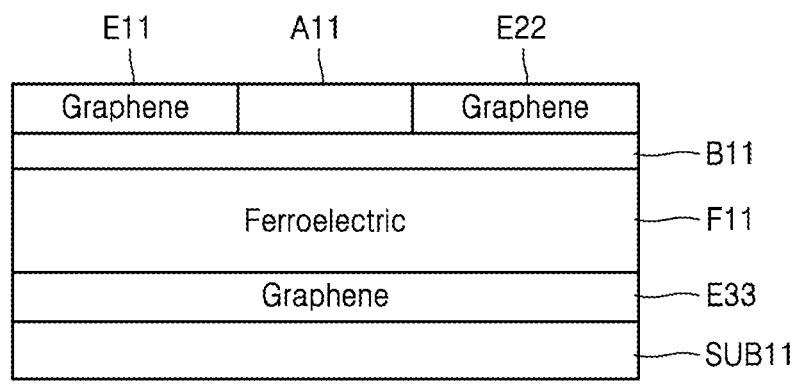
FIG. 13 is a cross-sectional view of an optoelectronic device according to another example embodiment.
Figure 14:
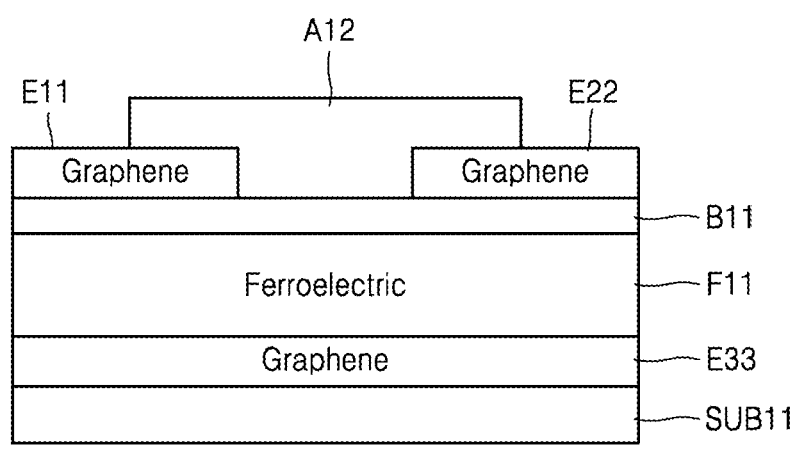
FIG. 14 is a cross-sectional view of an optoelectronic device according to another example embodiment.

In addition, according to another example embodiment, in the structures of FIGS. 11 and 12, a 'diffusion barrier layer' (diffusion prevention layer) may be formed between the ferroelectric layer F11 and the first and second electrodes E11 and E22. For example, as illustrated in FIGS. 13 and 14, a diffusion barrier layer B11 may be disposed on the ferroelectric layer F11, and a first electrode E11, a photoactive layer A11 or A12, and a second electrode E22 may be disposed on the diffusion barrier layer B11. A material and function of the diffusion barrier layer B11 may be substantially the same as or similar to the material and function of the diffusion barrier layer B10 of FIG. 6.

In the optoelectronic device (optoelectronic apparatus) according to one or more example embodiments, a flexible substrate, such as a polymer substrate, may be used as the substrate SUB10 or SUB11, and 2D materials may be used as the electrodes E10, E11, E20, E22, E30, and E33 and the photoactive layers A10, A11, and A12, and a flexible material, such as ferroelectric polymer, may be used to form the ferroelectric layers F10 and F11. In this case, a flexible, wearable or stretchable optoelectronic device may be implemented.

In the above-described various example embodiments, at least one of the electrodes E10, E11, E20, E22, E30, and E33 may be formed of a general conductive material instead of a 2D conductor (e.g., graphene), the photoactive layer A10, A11, or A12 may be formed of or include a general semiconductor material instead of a 2D semiconductor, and the diffusion barrier layer B10 or B11 may be formed of or include general insulator materials instead of 2D insulators. In addition, the ferroelectric layer F10 or F11 may be formed of or include an organic material or an inorganic material.

Although many matters have been specifically mentioned in the above description, they should be interpreted as example embodiments and not for purpose of limitation of the scope thereof. For example, the device structures illustrated in FIGS. 1 through 6 and FIGS. 11 through 14 may be modified by one of ordinary skill in the art in various ways. For example, the ferroelectric layer F10 or F11 may have a multi-layer structure, and an additional ferroelectric layer (a second ferroelectric layer) formed on a surface of the first electrode E10 may be further provided. Also, energy band diagrams of FIGS. 7A-7B through 10A-10B may be changed in various ways. In addition, the idea of the example embodiments may be applied to other semiconductor devices in addition to an optoelectronic device. Thus, the scope of the example embodiments should not be defined only by the example embodiments but should be defined by the technical idea of the claims.

It should be understood that the example embodiments described therein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An optoelectronic device comprising:
   a first electrode;
   a second electrode separate from the first electrode;
   a photoactive layer between the first and second electrodes;
   a diffusion barrier layer on a surface of the second electrode; and
   a ferroelectric layer on a surface of the diffusion barrier layer.

2. The optoelectronic device of claim 1, wherein the first electrode, the photoactive layer, the second electrode, the diffusion barrier and the ferroelectric layer are on a substrate in sequence.

3. The optoelectronic device of claim 1, wherein the ferroelectric layer, the diffusion barrier, the second electrode, the photoactive layer, and the first electrode are on a substrate in sequence.

4. The optoelectronic device of claim 1, wherein
   at least one of the first and second electrodes comprises graphene, and
   the photoactive layer comprises a two-dimensional (2D) semiconductor.

5. The optoelectronic device of claim 1, wherein the ferroelectric layer comprises at least one ferroelectric polymer.

6. The optoelectronic device of claim 1, wherein
   the ferroelectric layer has a positive or a negative polarization at a surface of the ferroelectric layer that is adjacent to the second electrode, and
   the ferroelectric layer is configured to adjust a height of an energy barrier between the second electrode and the photoactive layer.

7. The optoelectronic device of claim 1, wherein the optoelectronic device comprises a photodetector or a photovoltaic device.

8. The optoelectronic device of claim 7, wherein the photodetector comprises a self-powered photodetector.

9. The optoelectronic device of claim 1, further comprising a third electrode that is separate from the second electrode,
   wherein the ferroelectric layer is between the second and third electrodes.

10. The optoelectronic device of claim 9, wherein the first electrode, the photoactive layer, the second electrode, the diffusion barrier, the ferroelectric layer, and the third electrode are on a substrate in sequence.

11. The optoelectronic device of claim 9, wherein the third electrode, the ferroelectric layer, the diffusion barrier, the second electrode, the photoactive layer, and the first electrode are on a substrate in sequence.

12. The optoelectronic device of claim 9, wherein at least one of the first through third electrodes comprises graphene, and
    the photoactive layer comprises a 2D semiconductor.

13. The optoelectronic device of claim 9, wherein
    the second electrode, the ferroelectric layer, and the third electrode constitute a piezoelectric nanogenerator, and
    the piezoelectric nanogenerator is configured to generate electricity due to vibration.

14. The optoelectronic device of claim 9, further comprising an electric storage device connected to the first electrode, the second electrode, and the third electrode.

15. The optoelectronic device of claim 1, wherein
    the diffusion barrier layer comprises a 2D insulating layer, and
    the diffusion barrier layer has a thickness that is equal to or less than about 5 nm.

16. An optoelectronic apparatus comprising:
    an optoelectronic element including a photoactive layer;
    a nanogenerator connected to the optoelectronic element and including a ferroelectric substance; and
    an electric storage device connected to the optoelectronic element and the nanogenerator;
    wherein the optoelectronic apparatus includes a first graphene layer, a second graphene layer, and a third graphene layer,
    the photoactive layer is between the first graphene layer and the second graphene layer,
    the ferroelectric substance is between the second graphene layer and the third graphene layer, and
    a diffusion barrier layer is between the second graphene layer and the ferroelectric substance.

17. The optoelectronic apparatus of claim 16, wherein the photoactive layer comprises a two-dimensional (2D) semiconductor.

* * * * *